(12) United States Patent
Nakamura et al.

(10) Patent No.: US 6,855,369 B2
(45) Date of Patent: Feb. 15, 2005

(54) TRANSPARENT LAMINATE, METHOD FOR PRODUCING THE SAME, AND PLASMA DISPLAY PANEL

(75) Inventors: Toshitaka Nakamura, Ibaraki (JP); Kazuaki Sasa, Ibaraki (JP); Yoshihiro Hieda, Ibaraki (JP); Kazuhiko Miyauchi, Ibaraki (JP)

(73) Assignee: Nitto Denko Corporation, Ibaraki (JP)

(*) Notice: Subject to any disclaimer, the term of this patent is extended or adjusted under 35 U.S.C. 154(b) by 0 days.

(21) Appl. No.: 09/746,228

(22) Filed: Dec. 26, 2000

(65) Prior Publication Data

US 2001/0005554 A1 Jun. 28, 2001

(30) Foreign Application Priority Data

Dec. 27, 1999 (JP) .......................................... P.11-369355
Dec. 18, 2000 (JP) ....................................... P.2000-383072

(51) Int. Cl.[7] .............................. B05D 5/06; G02B 5/20; C23C 14/14; C23C 14/34
(52) U.S. Cl. ...................... 427/164; 427/109; 427/124; 427/125; 427/166; 427/250; 427/255.7; 427/404; 427/419.3; 204/192.1; 204/192.26; 204/192.28; 359/360; 359/588; 359/885
(58) Field of Search .............................. 427/64, 68–70, 427/108, 109, 124, 125, 164, 165, 166, 250, 255.32, 255.7, 404, 419.1, 419.2, 419.3, 163.1, 251; 204/192.1, 192.14, 192.15, 192.26, 192.28; 313/112, 489, 484; 359/359, 360, 580, 586, 588, 885, 589, 888, 890

(56) References Cited

U.S. PATENT DOCUMENTS 3,915,764 A * 10/1975 Noreika et al. ............. 117/108
4,833,020 A * 5/1989 Shiroishi et al. ............. 427/131
5,092,680 A * 3/1992 Kobayashi et al. ..... 250/227.11
5,754,297 A * 5/1998 Nulman .................. 250/559.27
6,040,056 A * 3/2000 Anzaki et al. ............... 428/432
6,104,530 A * 8/2000 Okamura et al. ........... 359/350
6,316,110 B1 * 11/2001 Anzaki et al. .............. 359/359

FOREIGN PATENT DOCUMENTS

| EP | 0 599 071 A1 | 10/1993 |
| EP | 0 810 452 A2 | 12/1997 |
| EP | 1 008 871 A2 | 6/2000 |
| EP | 1 043 606 A1 | 10/2000 |
| EP | 1 107 025 A2 | 6/2001 |
| JP | 55-11804 | 1/1980 |
| JP | 9-176837 | 7/1997 |
| JP | 09-176837 A | * 7/1997 |

* cited by examiner

Primary Examiner—Shrive P. Beck
Assistant Examiner—Wesley D. Markham
(74) Attorney, Agent, or Firm—McGinn & Gibb, PLLC (57) ABSTRACT

In a transparent laminate, n thin-film units (n=3 or 4) are laminated unit by unit successively on a surface of a substrate, and a high-refractive-index transparent thin film is deposited on a surface of the laminate of the n thin-film units, each of the n thin-film units consisting of a high-refractive-index thin film and a silver transparent conductive thin film. When the silver transparent conductive thin films are deposited by a vacuum dry process, the temperature T(K) of the transparent substrate at the time of film deposition is set to be in a range $340 \leq T \leq 410$, whereby the transparent laminate having a standard deviation of visible light transmittance which is not larger than 5% in a wave range of from 450 to 650 nm can be produced.

12 Claims, 1 Drawing Sheet

TRANSPARENT LAMINATE, METHOD FOR PRODUCING THE SAME, AND PLASMA DISPLAY PANEL

BACKGROUND OF THE INVENTION

1. Field of the Invention

The present invention relates to a transparent laminate, a method for producing the transparent laminate, and a plasma display panel (hereinafter referred to as "PDP") filter using the transparent laminate.

The present application is based on Japanese Patent Applications No. Hei. 11-369355 and 2000-383072, which are incorporated herein by reference.

2. Description of the Related Art

Nowadays in the society where information orientation is advancing remarkably, performance required of a display to be used as a terminal for displaying an image is diversified greatly. Especially, a great deal of attention has been paid to a PDP as a novel display succeeding a CRT and a liquid-crystal display because it is easy to increase the size of the PDP while reducing the thickness of the PDP. The PDP has already come onto the market.

In the PDP, electric discharge is produced in rare gas enclosed in the panel, especially, in gas containing neon as a main component. R, G and B fluorescent materials applied onto cells of the panel are made to emit fluorescence by vacuum ultraviolet rays generated at the electric discharge. In this light emission process, electromagnetic waves and near-infrared rays unnecessary for display on the PDP are emitted simultaneously. The electromagnetic waves need to be cut because they cause malfunctions of peripheral devices and have bad influence on human bodies. The near-infrared rays also need to be cut because there is a problem that remote controllers of household electronic appliances, karaoke, audio-video systems, etc. are made to malfunction by the near-infrared rays because the near-infrared rays have a wave range of from 850 to 1200 nm whereas the remote controllers have a light-receiving sensitivity range of from 700 to 1300 nm.

In a transparent laminate of the type having a structure in which a metal thin film is sandwiched between high-refractive-index transparent thin films, both the electrically conducting property and infrared reflecting property of the metal thin film can be utilized and, at the same time, a function of preventing reflection of visible rays on a metal surface of the metal thin film can be given to the transparent laminate by the high-refractive-index transparent thin films. Accordingly, such a transparent laminate is adapted to materials capable of transmitting visible rays but reflecting heat rays, such as a transparent heat-insulating material for solar cell, a window material for agricultural green house or building, a food showcase, etc. Further, the transparent laminate exhibits transparency and high electrical conductivity. Accordingly, such a transparent laminate is also adapted to materials such as liquid-crystal display electrodes, electric field light-emitting material electrodes, electromagnetic wave shielding films, anti-static films, etc. The structure of such a transparent laminate has been described in JP-A-55-11804, JP-A-9-176837, etc.

However, the aforementioned transparent laminate did not have performance permitting direct use as a PDP filter and, hence, it was unable to satisfy both high electromagnetic wave shielding property and near-infrared cutting property simultaneously. In use as a PDP filter, visible light transmitting property to prevent the display quality of the PDP from being spoiled is required intensively in addition to the aforementioned two properties. Especially, setting the color tone of the filter to neutral gray is required intensively. Anti-reflection property is further required from the point of view of prevention of mirroring of external light, light emitted from a fluorescent lamp, or the like. It was, however, impossible that these requirements were served by the aforementioned transparent laminate.

Particularly to set the color tone of the PDP filter to neutral gray, it is necessary that the transmittance of the PDP filter is kept constant in a visible light range or the transmittance of each wavelength is adjusted to make the color tone neutral gray. In the transparent laminate having a metal thin film sandwiched between high-refractive-index transparent thin films, it was not easy to keep the transmittance constant all over the visible light range. For example, an effort was made at adjusting the color tone to neutral gray by adding and uniformly dispersing a dye, or the like, capable of absorbing light with a specific wavelength into the transparent substrate, or the like. It was, however, not easy to adjust finely the respective amounts of a plurality of absorbents to be added and disperse uniformly the absorbents. Hence, there was a problem that a greater part of absorbents lacked durability as well as a high-grade technique was required.

SUMMARY OF THE INVENTION

Upon such circumstances, an object of the present invention is to provide a transparent laminate which can satisfy all properties such as electromagnetic wave shielding property, near-infrared cutting property, visible light transmitting property and visible light low-reflecting property required of a PDP filter in spite of a relatively simple structure of the transparent laminate and which can exhibit a color tone of neutral gray with little dependence of the transmittance of the transparent laminate on wavelengths in a visible light range without use of any absorbent such as dyes, or the like. Another object of the present invention is to provide a light-weight thin PDP filter of good visibility using the transparent laminate.

In the transparent laminate in which metal thin films and high-refractive-index transparent thin films are deposited by a vacuum dry process, it is known that each metal thin film with a thickness of from the order of nanometers to the order of tens of nanometers is formed not as a continuous flat film but as an island structure. The process of growth of the metal thin film is affected by the deposition temperature of the substrate, the deposition rate, the material of the substrate, the depositing method, etc. Especially, the process of growth of the metal thin film is apt to be affected by the deposition temperature and the deposition rate. Generally, when the temperature of the substrate is high, aggregation is apt to occur in the inside of the thin film. As a result, each of the islands is shaped like a sphere, so that it is difficult to form a continuous structure even in the case where the thickness of the thin film is relatively large. When the deposition rate is high, the number of islands increases and hence the density thereof becomes high. As a result, the thin film is easily formed as a continuous structure even in the case where the thickness of the thin film is relatively small ("Thin Film" written by Kinbara et al, published by Shokabo Co., Ltd., 1979).

When the metal thin film is formed as an island structure, abnormal light absorption called surface plasma resonance absorption occurs ("Thin Film Handbook" written by Namioka, published by Ohmsha Ltd., 1983). Particularly in the case of a silver transparent conductive thin film, the electromagnetic wave shielding function cannot be fulfilled sufficiently because electric resistance in the direction of width of the film is reduced remarkably as well as visible light transmittance in a certain wave range is reduced greatly by surface plasma resonance absorption. On the other hand, even in the case where the deposition rate is heightened to form a continuous film almost perfectly, dependence of transmittance on wavelengths is so large that the transparent laminate cannot exhibit the color tone of neutral gray though visible light transmittance is improved as a whole.

On the basis of the aforementioned knowledge, the inventors of the present invention have utilized the following condition when silver transparent conductive thin films suitable as metal thin films are formed on a transparent substrate by a vacuum dry process so that each silver transparent conductive thin film is sandwiched between high-refractive-index transparent thin films. That is, in the condition that the temperature of the transparent substrate and the deposition rate of the silver transparent conductive thin films are controlled, delicate light absorption different from the aforementioned general surface plasma resonance absorption occurs. As a result, wavelength dependence of visible light transmittance is reduced so that the transparent laminate can exhibit the color tone of neutral gray without addition of any absorbent such as a dye into the transparent substrate.

Moreover, the transparent laminate produced as described above has transmittance kept sufficiently high with respect to the whole visible light range and can satisfy all properties such as electromagnetic wave shielding property, near-infrared cutting property, visible light low-reflecting property, etc. required of a PDP film in spite of the aforementioned simple structure of the transparent laminate. Moreover, it has been found that a light-weight thin PDP filter of good visibility having the aforementioned properties can be obtained by use of the transparent laminate. The findings have resulted in accomplishing the present invention.

That is, according to an aspect of the present invention, there is provided a transparent laminate comprising a transparent substrate, n thin-film units (n=3 or 4) laminated unit by unit successively on a surface of the substrate, and a high-refractive-index transparent thin film deposited on a surface of laminate of the n thin-film units, each of the n thin-film units consisting of a high-refractive-index thin film and a silver transparent conductive thin film, wherein the standard deviation of visible light transmittance in a wave range of from 450 to 650 nm is not larger than 5%.

In the above transparent laminate, preferably, each of the silver transparent conductive thin films has a thickness in a range of from 5 to 20 nm, each of the high-refractive-index transparent thin film located on the surface of the transparent substrate and the high-refractive-index transparent thin film located in an outermost layer has a thickness in a range of 20 to 50 nm, and each of the other high-refractive-index transparent thin films located in an intermediate region between the high-refractive-index transparent thin film located on the surface of the transparent substrate and the high-refractive-index transparent thin film located as the outermost layer has a thickness in a range of 40 to 100 nm. Further, in the above transparent laminate, preferably, each of the silver transparent conductive thin films has an approximately constant thickness in a range of from 5 to 20 nm; each of the high-refractive-index transparent thin film located on the surface of the transparent substrate and the high-refractive-index transparent thin film located in an outermost layer has a thickness $(5/2) \times (1 \pm 0.15)$ times as large as the thickness of each of the silver transparent conductive thin films; and each of the other high-refractive-index transparent thin films located in an intermediate region between the high-refractive-index transparent thin film located on the surface of the transparent substrate and the high-refractive-index transparent thin film located as the outermost layer has a thickness $5 \times (1 \pm 0.15)$ times as large as the thickness of each of the silver transparent conductive thin films.

Incidentally, in this specification, the thickness of each of the thin films constituting the transparent laminate, that is, the thickness of each of the thin films such as high-refractive-index transparent thin films, silver transparent conductive thin films, etc. provided on the transparent substrate means a thickness (mass thickness) which is set to a predetermined value through measuring the film thickness of a sample subjected to a depositing process for a long time in one and the same condition (or the thickness of a sample thickened at a low roll speed in the case of roll-to-roll) by a feeler type thickness meter, or the like, and calculating the depositing time (or roll speed) on the basis of the measured film thickness.

Generally, the deposition rate in the case of roll-to-roll is often expressed in dynamic deposition rate (nm.m/sec). In this case, however, the deposition rate used in the present invention is calculated by R/L (nm/sec) when R (nm.m/sec) is the dynamic deposition rate and L (m) is the length of a sputtering target in the direction of the rotation of a roll. Hence, even in the case where the dynamic deposition rate is constant, the deposition rate used in the present invention varies in accordance with the length of the target.

In the above transparent laminate, preferably, the laminate further comprises a low-refractive-index transparent thin film deposited on the surface of the transparent substrate, the low-refractive-index transparent thin film having a refractive index $n_L$ in a range of from 1.3 to 1.6 and having a thickness of 550 nm×$(1/4\ n_L) \times (1 \pm 0.15)$. Tn the above transparent laminate according, preferably, the laminate further comprises a low-refractive-index transparent thin film deposited on a surface of the high-refractive-index transparent thin film locatied as the outermost layer, the low-refractive-index transparent thin film having a refractive index $n_L$ in a range of from 1.3 to 1.6 and having a thickness of 550 nm×$(1/2n_L) \times (1 \pm 0.15)$. Further, in place of such a low-refractive-index transparent thin film, the above transparent laminate further comprises any one of an anti-reflection film, an anti-mirroring film and a low-refection anti-mirroring film stuck on to the surface of the high-refractive-index transparent thin film located as the outermost layer, through a transparent adhesive layer. Accordingly, the transparent laminate configured as described above can be provided as a surface marproof transparent laminate without spoiling optical performance.

Further, according to another aspect of the present invention, there is provided a method for producing the transparent laminates, wherein, (i) when the silver transparent conductive thin films are deposited by the vacuum dry process, temperature T (K) of the transparent substrate at the time of the deposition of the films is set to be in a range $340 \leq T \leq 410$, or (ii) when the silver transparent conductive thin films are deposited by the vacuum dry process, temperature T (K) of the transparent substrate at the time of the deposition of the films is set to be in a range $340 \leq T \leq 390$, and deposition rate R (nm/sec) of the silver transparent conductive thin films is set to be $R=(1/40) \times (T-300) \pm 0.5$.

The present invention further relates to a PDP filter using the transparent laminate configured as described above. Generally, a transparent adhesive layer is preferably formed on a rear surface of the transparent laminate configured as described above so that the transparent laminate can be used as a PDP filter. In practical use, the PDP filter may be directly stuck onto a front display glass portion of a PDP through the transparent adhesive layer to thereby form a direct-sticking type PDP display device. As another usage, the aforementioned PDP filter may be stuck onto a surface (opposite to the PDP) of a transparent molded material disposed on the front side of the PDP through an air layer to thereby form a PDP front plate.

Features and advantages of the invention will be evident from the following detailed description of the preferred embodiments described in conjunction with the attached drawings.

DETAILED DESCRIPTION OF THE PREFERRED EMBODIMENTS

An example of a transparent laminate according to the present invention and an example of a PDP filter using the transparent laminate will be described below specifically with reference to FIGS. 1 and 2.

Figure 1:
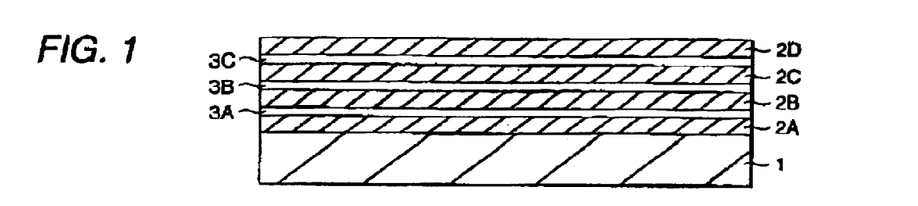
FIG. 1 is a sectional view showing an example of a transparent laminate according to the present invention.

FIG. 1 shows an example of the transparent laminate according to the present invention. Thin-film units (for example, three thin-film units in FIG. 1) each consisting of a combination of a high-refractive-index transparent thin film and a silver transparent conductive thin film are laminated repetitively successively on a surface of a transparent substrate 1. That is, in FIG. 1, high-refractive-index transparent thin films (2A, 2B and 2C) and silver transparent conductive thin films (3A, 3B and 3C) are laminated repetitively successively on the surface of the transparent substrate 1. A high-refractive-index transparent thin film 2D is further formed as the outermost layer on a surface of the silver transparent conductive thin film 3C. The present invention is characterized in that the standard deviation of visible light transmittance in a wave range of from 450 to 650 nm is set to be not larger than 5%, preferably not larger than 4%, especially not larger than 3% (generally 1%).

In the transparent laminate, thickness of each of the silver transparent conductive thin films (3A, 3B and 3C) is set to be in a range of from 5 to 20 nm, thickness of each of the high-refractive-index transparent thin film 2A located on the surface of said transparent substrate 1 and the high-refractive-index transparent thin film 2D located in an outermost layer is set to be in a range of 20 to 50 nm, and thickness of the other high-refractive-index transparent thin films located in an intermediate region between the high-refractive-index transparent thin film located on the surface of the transparent substrate and the high-refractive-index transparent thin film located as the outermost layer is set to be in a range of 40 to 100 nm. Especially, in this embodiment, the thickness of each of the silver transparent conductive thin films (3A, 3B and 3C) is set to be approximately constant in a range of from 5 to 20 nm. The thickness of each of the high-refractive-index thin films 2A and 2D located on the surface of the transparent substrate 1 and located as the outermost layer is set to be $(5/2) \times (1 \pm 0.15)$ times as large as the thickness of each of the silver transparent conductive thin films (3A, 3B and 3C). The thickness of each of the other high-refractive-index transparent thin films (2B and 2C) located in an intermediate region is set to be $5 \times (1 \pm 0.15)$ times as large as the thickness of each of the silver transparent conductive thin films (3A, 3B and 3C).

Incidentally, the high-refractive-index transparent thin films (2A, 2B, 2C and 2D) maybe formed of the same material or may be formed of different materials respectively. Similarly, the silver transparent conductive thin films (3A, 3B and 3C) may be formed of the same material or may be formed of different materials respectively. Although the aforementioned example has been described upon the case where three thin-film units each consisting of a combination of a high-refractive-index transparent thin film and a silver transparent conductive thin film are laminated repetitively, the number $\underline{n}$ of repeated units can be set to 4. If the number $\underline{n}$ of repeated units is smaller than 3, electromagnetic wave shielding property, near-infrared cutting property and visible light low-reflecting property cannot be satisfied at the same time. If the number $\underline{n}$ is larger than 4, it is difficult to obtain a desired result in terms of optical characteristic because of lowering of visible light transmittance, or the like. Further, manufacturing cost is increased.

Figure 2:
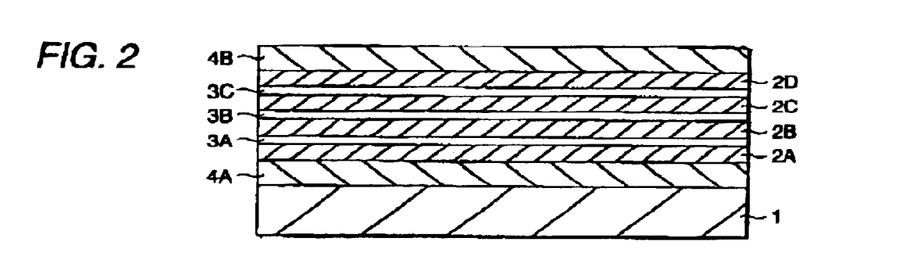
FIG. 2 is a sectional view showing another example of a transparent laminate according to the present invention.

FIG. 2 shows a modified example of the transparent laminate shown in FIG. 1. As shown in FIG. 2, a low-refractive-index transparent thin film 4A having a refractive index $n_L$ in a range of from 1.3 to 1.6 and having a thickness of 550 nm$\times(1/4n_L)\times(1\pm0.15)$ with respect to the optical center wavelength $\lambda$=550 nm is formed on the surface of the transparent substrate 1, that is, inserted in between the transparent substrate 1 and the high-refractive-index transparent thin film 2A. A low-refractive-index transparent thin film 4B having a refractive index $n_L$ in a range of from 1.3 to 1.6 and having a thickness of 550 nm$\times(1/2n_L)\times(1\pm0.15)$ with respect to the optical center wavelength $\lambda$=550 nm is further formed on the surface of the high-refractive-index transparent thin film 2D located as the outermost layer. The other configuration is quite the same as that in FIG. 1.

When, for example, the thickness of each of the silver transparent conductive thin films (3A, 3B and 3C) is selected to be 13 nm and the refractive index $n_L$ of each of the low-refractive-index transparent thin films (4A and 4B) is selected to be 1.4 in the respective transparent laminates shown in FIGS. 1 and 2, the thicknesses of the respective thin films are determined, rounded off to one decimal place, as follows.

High-refractive-index transparent thin films 2A, 2D:
32.5 nm±4.9 nm
High-refractive-index transparent thin films 2B, 2C:
65.0 nm±9.8 nm
Silver transparent conductive thin films 3A, 3B, 3C:
13 nm (approximately constant)
Low-refractive-index transparent thin film 4A:
98.2 nm±14.7 nm
Low-refractive-index transparent thin film 4B:
196.4 nm±29.5 nm The transparent laminate configured as described above according to the present invention can satisfy all properties such as electromagnetic wave shielding property, near-infrared cutting property, visible light transmitting property, visible light low-reflecting property, etc. required of a PDP filter in spite of the aforementioned simple configuration of the transparent laminate. Moreover, the transparent laminate fulfills an excellent effect that the transparent laminate exhibits the color tone of neutral gray without addition of any absorbent such as dyes into the transparent substrate because the dependence of visible light transmittance on wavelengths is small.

The transparent laminate can be produced as follows. That is, when the silver transparent conductive thin films (3A, 3B and 3C) are deposited by a vacuum dry process, the condition is set such that the temperature T (K) of the transparent substrate is set to be in a range $340 \leq T \leq 410$ at the deposition. More preferably, when the silver transparent conductive thin films (3A, 3B and 3C) are deposited by a vacuum dry process, the condition is set such that the temperature T (K) of the transparent substrate is set to be in arrange $340 \leq T \leq 390$ at the deposition and the deposition rate R (nm/sec) of the silver transparent conductive thin films (3A, 3B and 3C) is set to be $R=(1/40)\times(T-300)\pm 0.5$. According to this method, it is possible to obtain a transparent laminate which satisfies all the aforementioned properties required of a PDP filter. Further, the transparent laminate exhibits the color tone of neutral gray with small dependence of visible light transmittance on wavelengths so that delicate light absorption occurs in the silver transparent conductive thin films and the standard deviation of visible light transmittance in a wave range of from 450 to 650 nm is not larger than 5%.

According to the present invention, suitable choice of the temperature T of the transparent substrate and deposition rate R as aforementioned is significant in order to achieve more delicate light absorption as compared with the light absorption by the conventional silver transparent conductive thin film. For example, if temperature T of the transparent substrate is out of the aforementioned range, it is impossible to obtain a transparent laminate which satisfies all the aforementioned properties and which exhibits the color tone of neutral gray. Thus, if temperature T of the transparent substrate is lower than the aforementioned range, the transparent laminate cannot exhibit the color tone of neutral gray because the dependence of transmittance on wavelengths becomes large though each of the silver transparent conductive thin films is formed as a continuous film almost perfectly so that visible light transmittance is improved as a whole. Even if temperature T of the transparent substrate is lower than the aforementioned range, it is possible to obtain a transparent laminate which exhibits the color tone of neutral gray by extremely lowering the deposition rate R of the silver transparent conductive thin film. However, deposition time is prolonged (roll speed is lowered in the case of roll-to-roll deposition), so it becomes difficult to manufacture the transparent laminates in good productivity. In contrast, if temperature T of the transparent substrate is higher than the aforementioned range, visible light transmittance is lowered greatly because silver transparent conductive thin film is shaped like an island structure so that the silver transparent conductive thin film exhibits large absorption in a visible light range. Further, it becomes difficult to secure conduction in the width direction and electromagnetic wave shielding property is lowered.

In the producing method according to the present invention, the temperature T of the transparent substrate can be controlled by applying tension to the transparent substrate to bring the transparent substrate into close contact with a main roll which is adjusted by a heating medium flowing in the inside when, for example, film deposition is performed by roll-to-roll. The deposition rate R of each of the silver transparent conductive thin films can be controlled by adjusting electric power to be applied to the target of the silver transparent conductive thin film, for example, in the case of a sputtering method. The deposition rate can be calculated on the basis of the roll speed and the length of a region on which the silver transparent conductive thin film is deposited as vapor by the sputtering method.

A material exhibiting transparency in a visible light range and a certain degree of surface smoothness can be used as the transparent substrate 1 to be used in the present invention. For example, polyethylene terephthalate, triacetyl cellulose, polyethylene naphthalate, polyether-sulfone, polycarbonate, polyacrylate, polyether-ether-ketone, or the like, may be preferably used. The thickness of the transparent substrate is not particularly limited if there is no problem of thermal creasing in the dry process. Generally, the thickness of the transparent laminate is preferably set to be in a range of from 10 to 250 μm. Beside the aforementioned high-molecular film, a film having either surface or both surfaces coated with a hard coat layer may be used. The transparent layer 1 may be of an ultraviolet-curing type or of a heat-curing type, and the thickness thereof is preferably in a range of from 1 to 10 μm.

Any high-refractive-index optical film material can be used to some degree as the material of the high-refractive-index transparent thin films (2A, 2B, 2C and 2D). Preferably, a thin film material having a refractive index in a range of from 1.9 to 2.5 may be used. The material may be a single high-refractive-index transparent material or may be formed by sintering a plurality of high-refractive transparent materials. A material having an effect of preventing migration of silver or having an effect of making a barrier to water and oxygen is preferred more especially. Examples of the preferred material are: a material containing indium oxide as a main component and containing titanium dioxide, and further containing a small amount of tin oxide and cerium dioxide; titanium dioxide; zirconium oxide; zinc sulfide; bismuth oxide; niobium pentoxide; and so on. These thin films are deposited by a vacuum dry process such as sputtering, vacuum vapor deposition, ion-plating, etc.

The material of the silver transparent conductive thin films (3A, 3B and 3C) is constituted by a combination of 90% by weight or more of silver and one member or two or more members selected from the group consisting of gold, copper, palladium, platinum, manganese and cadmium. The preferred is a solid solution material composed of 90% by weight to 99% by weight of silver and 1% by weight to 10% by weight of the aforementioned metal. Especially, a solid solution material of silver containing 1% by weight to 10% by weight of gold is preferred from the point of view of prevention of deterioration of silver. If the amount of gold mixed with silver is larger than 10% by weight, it is difficult to obtain a low resistance value because of increase of specific resistance. If the amount of gold is smaller than 1% by weight, silver is apt to deteriorate. The silver transparent conductive thin films constituted by these materials are deposited by a vacuum dry process such as sputtering, or the like. As described above, the thickness of each of the silver transparent conductive thin films is set to be in a range of from 5 to 20 nm, preferably in a range of from 9 to 17 nm, especially in a range of from 11 to 14 nm.

A low-refractive-index optical material transparent to light in a visible light range can be used as the material of the low-refractive-index transparent thin films (4A and 4B). The preferred is a thin film material having a refractive index in a range of from 1.3 to 1.6. The thin films may be deposited by a vacuum dry process such as sputtering, vacuum vapor deposition, ion-plating, or the like, or may be deposited by a wet process such as gravure coating, micro-gravure coating, reverse coating, dip coating, or the like. The temperature of the transparent substrate 1 when the low-refractive-index transparent thin films (4A and 4B) is formed is not particularly defined. Even in the case where the low-refractive-index transparent thin films (4A and 4B) are formed at room temperature, the characteristic of the present invention is not disturbed at all.

A material permitting good contact between the transparent substrate 1 and the high-refractive-index transparent thin film 2A is preferably used as the material of the low-refractive-index thin film 4A. An easy bonding process such as a process of providing a primer layer on a surface of the transparent substrate 1 may be made. Examples of the preferred material are magnesium fluoride, silicon dioxide, fluorine-containing silicon oxide, heat-curing or ultraviolet-curing fluorine high-molecular materials, heat-curing or ultraviolet-curing silicone high-molecular materials, etc.

The low-refractive-index transparent thin film 4B may be made of the same material as the material of the low-refractive-index transparent thin film 4A or may be made of a material different therefrom. A material excellent in mar-proofness is preferably used so that the low-refractive-index transparent thin film 4B can serve as an overcoat layer on the outermost side. For this reason, the low-refractive-index transparent thin film 4B is preferably formed to be as thick as possible. According to the present invention, the film can be thickened more greatly as the refractive index decreases. Hence, a material having a refractive index as low as possible is preferably used. A material permitting the low-refractive-index transparent thin film 4B itself to have anti-contamination property may be used more preferably or an anti-contamination layer with a thickness of 10 nm or smaller may be formed on a surface of the low-refractive-index transparent thin film 4B. Examples of the preferred material are magnesium fluoride, silicon dioxide, fluorine-containing silicon oxide, heat-curing or ultraviolet-curing fluorine high-molecular materials, heat-curing or ultraviolet-curing silicone high-molecular materials, etc.

In the present invention, for example, in the transparent laminate shown in FIG. 2, the formation of the low-refractive-index transparent thin film 4B may be omitted. Further, any one of an anti-reflection film, an anti-mirroring film and a low-reflection anti-mirroring film may be stuck, in place of the formation of the low-refractive-index transparent thin film 4B, onto a surface of the high-refractive-index transparent thin film 3C located as the outermost layer through a transparent adhesive layer. Also in this case, a transparent laminate excellent in surface mar-proofness can be obtained without spoiling optical performance, or the like. As each of the aforementioned films, there can be used any kind of known film which is constituted by a film substrate such as a polyester film or a triacetyl cellulose film, and a single or multi-layer such as an anti-reflection film, an anti-mirroring layer or a low-reflection anti-mirroring layer provided on the transparent substrate.

With respect to various transparent laminates configured as described above according to the present invention, generally, a transparent adhesive layer is formed on the rear surface side of the transparent laminate, thus, on the rear surface side of the transparent substrate 1 so that the transparent laminate can be used as a light-weight thin PDP filter of good visibility having the aforementioned properties. In practical use, the PDP filter may be directly stuck onto a front display glass portion of a PDP through the transparent adhesive layer to thereby form a direct-sticking type PDP display device. Alternatively, the PDP filter may be stuck, through the transparent adhesive layer, onto a surface (opposite to the PDP) of a transparent molded material disposed on the front side of the PDP through an air layer to thereby form a PDP front plate.

The former direct-sticking type PDP display device can contribute to prevention of scattering of glass, reduction in weight, size and cost of the PDP itself, etc. Moreover, the problem of increase of visible light reflectivity, double reflection, etc. caused by excessive interfacial reflection can be solved because the air layer low in refractive index can be eliminated compared with the case where the PDP front plate is disposed. Hence, visibility of the PDP can be improved remarkably. On the other hand, the latter PDP front plate can be particularly adapted to the case where a glass member to be used in the PDP has a problem in shortage of strength, etc.

The present invention will be described below more specifically on the basis of examples thereof while the present invention is not limited to the following examples.

EXAMPLE 1

Three thin-film units each unit consisting of a combination of a high-refractive-index transparent thin film and a silver transparent conductive thin film were deposited successively on one side of a 125 $\mu$m-thick transparent polyethylene terephthalate (hereinafter referred to as "PET") film by a DC magnetron sputtering method. A high-refractive-index transparent thin film was further deposited on a surface of the laminate of the three thin-film units. Thus, a transparent laminate was produced by the aforementioned method. In this occasion, $In_2O_3$ containing 12.6% by weight of $TiO_2$ (hereinafter abbreviated as "IT") was used as a target material for depositing the high-refractive-index transparent thin films and Ag containing 5% by weight of Au (hereinafter abbreviated as "Ag") was used as a target material for depositing the silver transparent conductive thin films.

Film thickness was controlled by use of the analytical curve of the deposition rate obtained on the basis of film thickness measured by a surface roughness meter (DEKTAK3) attached to a thick film. As an example, when DC power of 3 W/cm$^2$ was applied as sputtering power to the IT target and DC power of 0.55 W/cm$^2$ was applied as sputtering power to the Ag target, the deposition rate of IT was 1.6 nm/sec and the deposition rate of Ag was 1.8 nm/sec. Each deposition rate was approximately proportional to the sputtering power. The length of the Ag target used in Example 1 was 16 cm. Hence, the roll speed for depositing an Ag film with a thickness of 13 nm was determined to be [1.8 (nm/sec)×0.16 (m)]/13 (nm)=0.0222 (m/sec)=1.329 (m/min). Thin films with predetermined thicknesses were deposited by a roll-to-roll sputtering apparatus. Further, the roll temperature was controlled by adjustment of the temperature of a heating medium circulating in the inside.

In the aforementioned method, the roll temperature (equivalent to the temperature of the PET film which was the transparent substrate) and the deposition rate of Ag were set as follows to produce four kinds of transparent laminates as samples (1) to (4). The thicknesses of respective thin films in these transparent laminates were as shown in numerical values (unit: nm) put in the following parentheses.

Sample (1)

PET/IT(32.5)/Ag(13)/IT(65)/Ag(13)/IT(65)/Ag(13)/IT(32.5)

<Roll Temperature: 373 K, deposition rate of Ag: 1.8 nm/sec>

Sample (2)

PET/IT(32.5)/Ag(13)/IT(65)/Ag(13)/IT(65)/Ag(13)/IT(32.5)

<Roll Temperature: 353 K, deposition rate of Ag: 1.3 nm/sec>

Sample (3)

PET/IT(32.5)/Ag(9)/IT(65)/Ag(12)/IT(65)/Ag(15)/IT(32.5)<Roll Temperature: 403 K, deposition rate of Ag: 12.5 nm/sec>

Sample (4)

PET/IT(32.5)/Ag(9)/IT(65)/Ag(12)/IT(65)/Ag(15)/IT(32.5)

<Roll Temperature: 373 K, deposition rate of Ag: 4.5 nm/sec>

Comparative Example 1

Transparent laminates as samples (5) and (6) were produced in the same manner as that in Example 1 except that the roll temperature and the deposition rate of Ag were set as follows. That is, three thin-film units each consisting of a combination of an IT thin film and an Ag thin film were deposited successively on a PET film, and an IT thin film was further deposited on a surface of the laminate of the three thin-film units. These transparent laminates were examples in which the deposition temperature of Ag was lower than the range defined by the present invention. The thicknesses of respective thin films were as shown in numerical values (unit: nm) put in the following parentheses.

Sample (5)

PET/IT(32.5)/Ag(13)/IT(65)/Ag(13)/IT(65)/Ag(13)/IT(32.5)

<Roll Temperature: 333 K, deposition rate of Ag: 2.0 nm/sec>

Sample (6)

PET/IT(32.5)/Ag(13)/IT(65)/Ag(13)/IT(65)/Ag(13)/IT(32.5)

<Roll Temperature: 303 K, deposition rate of Ag: 0.8 nm/sec>

Comparative Example 2

Transparent laminates as samples (7) and (8) were produced in the same manner as that in Example 1 except that the roll temperature and the deposition rate of Ag were set as follows. That is, three thin-film units each consisting of a combination of an IT thin film and an Ag thin film were deposited successively on a PET film, and an IT thin film was further deposited on a surface of the laminate of the three thin-film units. These transparent laminates were examples in which the temperature of the transparent substrate at Ag deposition was higher than the range defined by the present invention. The thicknesses of respective thin films were as shown in numerical values (unit: nm) put in the following parentheses.

Sample (7)

PET/IT(32.5)/Ag(13)/IT(65)/Ag(13)/IT(65)/Ag(13)/IT(32.5)

<Roll Temperature: 413 K, deposition rate of Ag: 2.0 nm/sec>

Sample (8)

PET/IT(32.5)/Ag(9)/IT(65)/Ag(12)/IT(65)/Ag(15)/IT(32.5)

<Roll Temperature: 413 K, deposition rate of Ag: 12.5 nm/sec>

Figure 3:
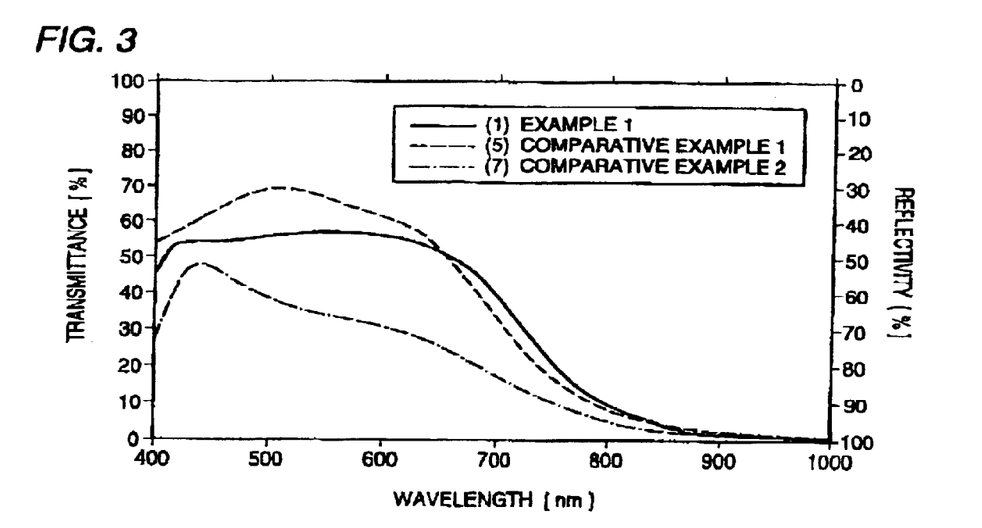
FIG. 3 is a characteristic graph showing optical characteristic of the transparent laminate in each of samples (1), (5) and (7) according to Example 1 and Comparative Examples 1 and 2.

Transmission spectra expressing optical characteristics of the respective transparent laminates shown in the sample (1) according to Example 1, the sample (5) according to Comparative Example 1 and the sample (7) according to Comparative Example 2 were examined and shown in FIG. 3. It was apparent from the results shown in FIG. 3 that the transparent laminate shown in the sample (1) according to Example 1 had flat characteristic and exhibited the color tone of neutral gray because the wavelength dependence of transmittance in a visible light range was small.

On the contrary, the transparent laminate shown in the sample (5) according to comparative Example 1 with the deposition temperature of Ag lower than the range defined by the present invention was obtained as a transparent laminate high in transmittance as a whole but could not be used suitably as a PDP filter because the transparent laminate had high transmittance to a wavelength of 500 nm and exhibited the color tone of green. Further, the transparent laminate shown in the sample (7) according to Comparative Example 2with the deposition temperature of Ag higher than the range defined by the present invention was so large in absorption that the transmittance of a filter was lowered remarkably conversely to the transparent laminate shown in the sample (5) according to Comparative Example 1. Also the transparent laminate shown in the sample (7) could not be used suitably as a PDP filter because the transparent laminate exhibited the color tone of dark blue.

Then, the PDP filter characteristics of the transparent laminates shown in the samples (1) to (8) according to Example 1 and Comparative Examples 1 and 2 were examined and shown in Tables 1 and 2 (Example) and Table 3 (Comparative Example). In the two Tables, surface resistance values were measured by use of "Lorester SP" made by Mitsubishi Petrochemical Co., Ltd. The optical characteristics of the transparent laminates were measured by use of "U-3410" made by Hitachi, Ltd. Especially, the measurement of reflectivity was performed in the condition that the surface of the transparent laminate having no thin film deposited thereon was painted with black. Further, visible light transmittance and visible light reflectivity were calculated on the basis of the obtained transmission and reflection spectra in accordance with JIS R-3016. In the color tone of transmitted light, "ND" means neutral gray, "G" means green, and "DB" means dark blue.

TABLE 1

| | Example | |
|---|---|---|
| Sample Number | (1) | (2) |
| Surface Resistance (Ω/sq) | 1.6 | 1.6 |
| Visible Light Transmittance (%) | | |
| Wavelength: 450 nm | 54.8 | 55.9 |
| Wavelength: 500 nm | 56.5 | 57.7 |
| Wavelength: 550 nm | 57.7 | 58.8 |
| Wavelength: 600 nm | 56.7 | 57.7 |
| Wavelength: 650 nm | 52.6 | 53.1 |
| Standard Deviation | 2.0 | 2.2 |
| Average Luminosity Transmittance (%) | 57.0 | 58.1 |
| Near-Infrared Cutting Rate (%) <wavelength: 850 nm> | 95.6 | 95.2 |

TABLE 1-continued

| | Example | |
|---|---|---|
| Sample Number | (1) | (2) |
| Average Luminosity Reflectivity (%) | 2.7 | 2.8 |
| Color Tone of Transmitted Light | ND | ND |

TABLE 2

| | Example | |
|---|---|---|
| Sample Number | (3) | (4) |
| Surface Resistance (Ω/sq) | 1.8 | 1.9 |
| Visible Light Transmittance (%) | | |
| Wavelength: 450 nm | 53.9 | 54.0 |
| Wavelength: 500 nm | 55.9 | 58.9 |
| Wavelength: 550 nm | 58.2 | 61.5 |
| Wavelength: 600 nm | 58.0 | 59.3 |
| Wavelength: 650 nm | 52.4 | 55.1 |
| Standard Deviation | 2.5 | 3.1 |
| Average Luminosity Transmittance (%) | 56.4 | 60.1 |
| Near-Infrared Cutting Rate (%) <wavelength: 850 nm> | 95.3 | 94.4 |
| Average Luminosity Reflectivity (%) | 0.9 | 0.8 |
| Color Tone of Transmitted Light | ND | ND |

TABLE 3

| | Comparative Example | | | |
|---|---|---|---|---|
| Sample Number | (5) | (6) | (7) | (8) |
| Surface Resistance (Ω/sq) | 1.8 | 1.8 | 5.9 | 6.6 |
| Visible Light Transmittance (%) | | | | |
| Wavelength: 450 nm | 63.8 | 63.1 | 37.5 | 45.3 |
| Wavelength: 500 nm | 69.8 | 68.9 | 32.6 | 34.1 |
| Wavelength: 550 nm | 66.7 | 69.1 | 25.9 | 30.2 |
| Wavelength: 600 nm | 61.8 | 61.2 | 18.8 | 25.4 |
| Wavelength: 650 nm | 52.9 | 53.8 | 13.6 | 16.0 |
| Standard Deviation | 6.4 | 6.3 | 9.8 | 10.8 |
| Average Luminosity Transmittance (%) | 65.3 | 67.7 | 24.9 | 29.7 |
| Near-Infrared Cutting Rate (%) <wavelength: 850 nm> | 95.4 | 95.1 | 98.2 | 98.1 |
| Average Luminosity Reflectivity (%) | 2.7 | 2.6 | 2.4 | 0.8 |
| Color Tone of Transmitted Light | G | G | DB | DB |

It was apparent from the results shown in Table 1 and Table 2 that each of the transparent laminates shown in the samples (1) to (4) according to Example 1 was a transparent laminate which exhibited the color tone of neutral gray because the standard deviation of visible light transmittance in a wave range of from 450 to 650 nm was not larger than 5% and which can sufficiently satisfy basic characteristics, such as surface resistance, near-infrared cutting rate, visible light transmittance and visible light reflectivity, essential to a PDP filter.

On the contrary, each of the transparent laminates shown in the samples (5) to (8) according to Comparative Examples 1 and 2 exhibited the color tone of green or dark blue because the standard deviation of visible light transmittance in a wave range of from 450 to 650 nm was larger than 5%. Particularly in the transparent laminates shown in the samples (7) and (8) according to Comparative Example 2, remarkable lowering of transmittance and increase of surface resistance were observed simultaneously. It was conceived that this was owing to the fact that an island structure remained in each of the silver transparent conductive thin films because the silver transparent conductive thin film was not perfectly deposited as a continuous film.

EXAMPLE 2

An $SiO_2$ layer was deposited on a 125 μm-thick transparent PET film at room temperature by a vacuum vapor deposition method. The refractive index $n_L$ of $SiO_2$ measured by an ellipsometer was 1. 45. The thickness of the $SiO_2$ layer was set to be 95 nm. Three thin-film units each consisting of a combination of an IT thin film and an Ag thin film were deposited successively on a surface of the $SiO_2$ layer in the same manner as in Example 1. An IT thin film was further deposited on a surface of the laminate of the three thin-film units. Thus, a transparent laminate was produced as a sample (9). The thicknesses of respective thin films were as shown in numerical values (unit: nm) put in the following parentheses. The roll temperature for depositing the IT thin films and the Ag thin films and the deposition rate of Ag were as follows.

Sample (9)

PET/$SiO_2$(95)/IT(32.5)/Ag(13)/IT(65)/Ag(13)/IT(65)/Ag(13)/IT(32.5)

<Roll Temperature: 373 K, deposition rate of Ag: 1.8 nm/sec>

EXAMPLE 3

In the transparent laminate produced in Example 2, an $SiO_2$ layer was deposited on a surface of the IT thin film located as the outermost layer at room temperature by a vacuum vapor deposition method so that the thickness of the $SiO_2$ layer was set to be 190 nm. Thus, a transparent laminate was produced as a sample (10). The thicknesses of respective thin films were as shown in numerical values (unit: nm) put in the following parentheses.

Sample (10)

PET/$SiO_2$(95)/IT(32.5)/Ag(13)/IT(65)/Ag(13)/IT(65)/Ag(13)/IT(32.5)/$SiO_2$(190)

EXAMPLE 4

In the transparent laminate produced in Example 2, an available anti-reflection film (tradename: "REARLOOK 2200" made by Nippon Oils & Fats Co., Ltd.) was stuck onto a surface of the IT thin film located as the outermost layer through a transparent adhesive agent. Thus, a transparent laminate was produced as a sample (11). The thicknesses of respective thin films were as shown in numerical values (unit: nm) put in the following parentheses.

Sample (11)

PET/$SiO_2$(95)/IT(32.5)/Ag(13)/IT(65)/Ag(13)/IT(65)/Ag(13)/IT(32.5)/Transparent Adhesive Layer/Anti-Reflection Film Comparative Example 3

A transparent laminate as a sample (12) was produced in the same manner as that in Example 3 except that the deformation of the 95 nm-thick $SiO_2$ film on the surface side of the transparent PET film was omitted. The thicknesses of respective thin films were as shown in numerical values (unit: nm) put in the following parentheses.

Sample (12)

PET/IT(32.5)/Ag(13)/IT(65)/Ag(13)/IT(65)/Ag(13)/IT(32.5)/$SiO_2$(190)

Comparative Example 4

A transparent laminate as a sample (13) was produced in the same manner as that in Example 4 except that the deposition of the 95 nm-thick SiO$_2$ film on the surface side of the transparent PET film was omitted. The thicknesses of respective thin films were as shown in numerical values (unit: nm) put in the following parentheses.

Sample (13)

PET/IT(32.5)/Ag(13)/IT(65)/Ag(13)/IT(65)/Ag(13)/IT(32.5)/Transparent Adhesive Layer/Anti-Reflection Film The PDP filter characteristics of the transparent laminates shown in the samples (9) to (11) according to Examples 2 to 4 and the samples (12) and (13) according to Comparative Examples 3 and 4 were examined in the same manner as described above. Results of the examination were as shown in Table 4. Incidentally, the surface resistance values were measured at a point of time when the IT thin film located as the outermost layer was deposited. The description of the surface resistance values on Table 4 was, however, omitted because the surface resistance values were 1.6Ω/□ in all the samples without exception. Further, a mar-proof test was performed as follows. The surface of each transparent laminate was rubbed ten times with #0000 steel wool under a load of 2.45×10$^{-4}$ N/m$^2$. The degree of scars on the surface was observed by eyes. Absence of any scar was evaluated as ○ and presence of some scar was evaluated as ×. Results of the evaluation were also shown in Table 4.

TABLE 4

| Sample Number | Example | | | Comparative Example | |
|---|---|---|---|---|---|
| | (9) | (10) | (11) | (12) | (13) |
| Marproofness | X | O | O | O | O |
| Visible Light Transmittance (%) | | | | | |
| Wavelength: 450 nm | 55.9 | 52.5 | 50.9 | 51.4 | 48.8 |
| Wavelength: 500 nm | 57.5 | 55.9 | 54.2 | 54.2 | 51.5 |
| Wavelength: 550 nm | 58.8 | 56.3 | 54.7 | 53.9 | 50.7 |
| Wavelength: 600 nm | 57.9 | 55.0 | 53.4 | 53.4 | 51.2 |
| Wavelength: 650 nm | 53.5 | 51.4 | 49.9 | 50.4 | 48.4 |
| Standard Deviation | 2.1 | 2.2 | 2.1 | 1.7 | 1.4 |
| Average Luminosity Transmittance (%) | 58.1 | 55.9 | 53.2 | 52.8 | 49.7 |
| Near-Infrared Cutting Rate (%) <wavelength: 850 nm> | 95.5 | 96.3 | 97.1 | 96.8 | 96.9 |
| Average Luminosity Reflectivity (%) | 0.9 | 2.7 | 2.9 | 4.8 | 7.1 |
| Color Tone of Transmitted Light | ND | ND | ND | ND | ND |

From the results shown in Table 4, each of the transparent laminates shown in the samples (9) to (11) according to Examples 2 to 4 was small in the standard deviation of visible light transmittance in a wave range of from 450 to 650 nm and exhibited the color tone of neutral gray. Of these, the transparent laminate shown in the sample (9) according to Example 2 had a low average luminosity reflectivity of 0.9% and was superior in use as a PDP filter from the point of view of prevention of mirroring of external light or light emitted from a fluorescent lamp but was inferior in surface mar-proofness. The surface mar-proofness as well as the average luminosity reflectivity of the transparent laminates were suppressed to be not larger than 3% in the transparent laminate shown in the sample (10) according to Example 3 and having SiO$_2$ deposited as a protective layer on a surface of the IT thin film located as the outermost layer of the transparent laminate shown in the sample (9), and in the transparent laminate shown in the sample (11) according to Example 4 and having an available anti-reflection film stuck onto the surface of the IT thin film. Also each of the transparent laminates shown in the samples (12) and (13) according to Comparative Examples 3 and 4 was small in the standard deviation of visible light transmittance in a wave range of from 450 to 650 nm and exhibited the color tone of neutral gray. In the transparent laminate shown in the sample (12) according to Comparative Example 3, however, SiO$_2$ was not deposited on a surface of the transparent substrate but deposited as a protective layer on a surface of the IT thin film located as the outermost layer. Similarly, in the transparent laminate shown in the sample (13) according to Comparative Example 4, SiO$_2$ was not deposited on a surface of the transparent substrate but an available anti-reflection film was stuck as a protective layer onto a surface of the IT thin film located as the outermost layer. Hence, the average luminosity reflectivity of each of the transparent laminates shown in the samples (12) and (13) exceeded 3% so that visibility of the PDP was blocked remarkably though the transparent laminates satisfied surface mar-proofness.

As described above, according to the present invention, the following condition is set when silver transparent conductive thin films are deposited on a transparent substrate by a vacuum dry process so that each of the silver transparent conductive thin films is sandwiched between high-refractive-index transparent thin films. In the condition that the temperature of the transparent substrate and the deposition rate of the silver transparent conductive thin films are controlled there can be provided a transparent laminate which satisfies all properties such as electromagnetic wave shielding property, near-infrared cutting property, visible light transmitting property and visible light low-reflecting property required of a PDP filter in spite of a relatively simple structure of the transparent laminate and which is easy to have surface mar-proofness and small in wavelength dependence of transmittance in a visible light range so that the transparent laminate exhibits the color tone of neutral gray without use of any absorbent such as a dye. A lightweight thin PDP filter of good visibility can be provided by use of the transparent laminate.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method for producing a transparent laminate comprising:
   preparing a transparent substrate;
   depositing a high-refractive-index transparent thin film by a vacuum dry process;
   depositing a silver transparent conductive thin film by a vacuum dry process;
   repeating forming of the high-refractive-index transparent thin film and the silver transparent conductive thin film at least three times to thereby form at least three combination thin-film layers of the high-refractive-index transparent thin film and the silver transparent conductive thin film successively laminated on a surface of said transparent substrate; and
   depositing another high-refractive-index transparent thin film on a surface of said combination thin-film layer by the vacuum dry process,
   wherein, when said silver transparent conductive thin films are deposited by the vacuum dry process, a temperature T (K) of said transparent substrate at the time of the deposition of said films is set to be in a range $340 \leq T \leq 390$, and a deposition rate R (nm/sec) of said silver transparent conductive thin films is set to be R=(1/40)×(T−300)±0.5.

2. The method of claim 1, further comprising depositing a low-refractive-index transparent thin film.

3. The method of claim 2, wherein the low-refractive-index transparent thin film is deposited before any high-refractive-index thin film is deposited.

4. The method of claim 2, wherein the low-refractive-index transparent thin film is deposited after all of the high-refractive-index thin films are deposited.

5. The method of claim 1, further comprising disposing said transparent laminate in front of a display portion of a plasma display panel.

6. The method of claim 1, wherein said vacuum dry process comprises a sputtering process.

7. The method of claim 1, wherein said silver transparent conductive thin film comprises silver and 5% by weight of gold.

8. The method of claim 1, wherein said repeated depositing is repeated three times to form three combination thin-film layers.

9. The method of claim 1, wherein said silver transparent conductive thin films comprise a thickness in range from 5 nm to 20 nm.

10. The method of claim 1, wherein said high-refractive-index transparent thin film which is formed on said transparent substrate and said another high-refractive-index transparent thin film comprise a thickness in a range from 20 nm to 50 nm.

11. The method of claim 1, wherein said high-refractive-index transparent thin films other than said high-refractive-index transparent thin film which is formed on said transparent substrate and said another high-refractive-index transparent thin film, comprise a thickness in a range from 40 nm to 100 nm.

12. A method for producing a transparent laminate comprising:

depositing a high-refractive-index transparent thin film on a transparent substrate by a vacuum dry process;

depositing a silver transparent conductive thin film on said high-refractive-index transparent thin film by a vacuum dry process;

repeating the depositing of the high-refractive-index transparent thin film and the silver transparent conductive thin film at least three times to thereby form at least three combination thin-film layers of the high-refractive-index transparent thin film and the silver transparent conductive thin film successively laminated on said transparent substrate; and depositing another high-refractive-index transparent thin film on said combination thin-film layers by a vacuum dry process, wherein at the time of the deposition of said silver transparent conductive thin films, a temperature T (K) of said transparent substrate is set to be in a range 340≦T≦390, and a deposition rate R (nm/sec) of said silver transparent conductive thin films is set to be R=(1/40)×(T−300).

* * * * *